US011940733B2

(12) United States Patent
Tajima et al.

(10) Patent No.: US 11,940,733 B2
(45) Date of Patent: Mar. 26, 2024

(54) TREATMENT DEVICE AND TREATMENT METHOD

(71) Applicant: FUJIFILM Corporation, Tokyo (JP)

(72) Inventors: Seiji Tajima, Haibara-gun (JP); Fumio Mogi, Haibara-gun (JP); Toshihiro Watanabe, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 155 days.

(21) Appl. No.: 17/824,471

(22) Filed: May 25, 2022

(65) Prior Publication Data

US 2022/0291588 A1    Sep. 15, 2022

Related U.S. Application Data

(63) Continuation of application No. PCT/JP2020/042939, filed on Nov. 18, 2020.

(30) Foreign Application Priority Data

Nov. 26, 2019  (JP) ................................. 2019-213090

(51) Int. Cl.
    *G03F 7/20*       (2006.01)
    *G03F 7/32*       (2006.01)
    *B41M 1/04*     (2006.01)

(52) U.S. Cl.
    CPC .............. *G03F 7/2012* (2013.01); *G03F 7/32* (2013.01); *B41M 1/04* (2013.01)

(58) Field of Classification Search
    CPC .......... G03F 7/20; G03F 7/3042; G03F 7/305; G03F 7/3057; G03F 7/3071; G03F 7/2012; G03F 7/32; B41N 1/12; B41M 1/04
    See application file for complete search history.

(56) References Cited

U.S. PATENT DOCUMENTS 4,969,002 A * 11/1990 Nakayama ............ G03F 7/3042
                                                       396/617
5,138,353 A * 8/1992 Ohba .................... G03F 7/3042
                                                       396/627

(Continued)

FOREIGN PATENT DOCUMENTS

EP           0897136 B1     8/2003
EP           2778782 A1     9/2014
(Continued)

OTHER PUBLICATIONS

Office Action dated Mar. 22, 2023 in Japanese Application No. 2021-561341.

(Continued)

*Primary Examiner* — David H Banh
(74) *Attorney, Agent, or Firm* — Sughrue Mion, PLLC

(57) ABSTRACT

Provided are a treatment device and a treatment method capable of easily reusing a used rinsing liquid, and reducing the amount of waste liquid. A treatment device has: a developing portion which is provided with a developing unit which performs development by removing a non-exposed portion of a flexographic printing plate precursor after imagewise exposure using a developer containing a washing solution; a rinsing portion which is provided with a rinsing liquid supply portion which supplies a rinsing liquid containing substantially only water as a component to at least a surface of the flexographic printing plate precursor after development, from which the non-exposed portion of the flexographic printing plate precursor has been removed; a developer storage portion which has a developer storage tank which stores the developer which is used for the development in the developing portion; a first liquid feeding path through which the developer after development is fed to the developer storage tank of the developer storage portion; and a second liquid feeding path different from the (Continued)

first liquid feeding path, through which the rinsing liquid supplied by the rinsing portion is fed to the developer storage tank of the developer storage portion, and the developing portion repeatedly uses the developer stored in the developer storage tank of the developer storage portion to perform the development.

20 Claims, 6 Drawing Sheets

(56) References Cited

U.S. PATENT DOCUMENTS

| | | | | |
|---|---|---|---|---|
| 5,217,848 | A * | 6/1993 | Uehara | G03F 7/3078 101/463.1 |
| 5,349,413 | A * | 9/1994 | Ohishi | G03D 3/065 396/626 |
| 5,686,231 | A * | 11/1997 | Kasakura | B01D 61/145 430/398 |
| 5,822,641 | A * | 10/1998 | Furukawa | G03D 13/002 396/575 |
| 5,930,547 | A * | 7/1999 | Stein | G03F 7/3071 396/626 |
| 6,247,856 | B1 | 6/2001 | Shibano et al. | |
| 6,315,467 | B1 * | 11/2001 | Oishi | G03F 7/3071 396/626 |
| 2004/0060466 | A1 * | 4/2004 | Nozawa | G03D 5/04 101/477 |
| 2018/0004090 | A1 * | 1/2018 | Swihart | G03F 7/3057 |
| 2019/0204745 | A1 | 7/2019 | Aviel et al. | |
| 2020/0192226 | A1 * | 6/2020 | Shirakawa | G03F 7/2012 |

FOREIGN PATENT DOCUMENTS

| | | |
|---|---|---|
| JP | 8-082937 A | 3/1996 |
| JP | 10-123722 A | 5/1998 |
| JP | 2019-057637 A | 4/2019 |

OTHER PUBLICATIONS

International Search Report dated Jan. 26, 2021 in International Application No. PCT/JP2020/042939.
Written Opinion of the International Searching Authority dated Jan. 26, 2021 in International Application No. PCT/JP2020/042939.
International Preliminary Report on Patentability dated May 17, 2022 in International Application No. PCT/JP2020/042939.
Extended European Search Report dated Jan. 2, 2023 in Application No. 20894568.3.

* cited by examiner

TREATMENT DEVICE AND TREATMENT METHOD

CROSS-REFERENCE TO RELATED APPLICATIONS

This application is a Continuation of PCT International Application No. PCT/JP2020/042939 filed on Nov. 18, 2020, which claims priority under 35 U.S.C. § 119(a) to Japanese Patent Application No. 2019-213090 filed on Nov. 26, 2019. The above application is hereby expressly incorporated by reference, in its entirety, into the present application.

BACKGROUND OF THE INVENTION

1. Field of the Invention

The present invention relates to a treatment device and a treatment method for supplying a rinsing liquid containing substantially only water as a component to at least a surface of a flexographic printing plate after development of a flexographic printing plate precursor after imagewise exposure, and particularly to a treatment device and a treatment method reusing a used rinsing liquid for development.

2. Description of the Related Art

Various methods have been known as a method for developing a printing plate formed of a photosensitive resin plate. For example, development is performed as follows: a developer containing a surfactant as a component is poured to a photosensitive resin plate after imagewise exposure, and brushing is performed to wash out the uncured resin and the like as a non-exposed portion in the photosensitive resin plate after imagewise exposure. After development, a rinsing treatment is performed to remove the treatment liquid containing a surfactant and the uncured resin adhering to the plate. The rinsing treatment is a step of washing out the developer on the developed plate, the uncured resin, and the like using washing water such as tap water containing no solid content or surfactant as a rinsing liquid. In a case where the rinsing liquid after the rinsing treatment is mixed with the developer, the surfactant concentration and the chelating agent concentration in the developer are reduced, and thus the rinsing liquid is discarded so as not to be mixed with the developer.

For example, JP1998-123722A (JP-110-123722A) describes a developing device for a photosensitive printing plate precursor having a brush which is brought into slide-contact with a surface of a photosensitive plate material and is moved relative to the photosensitive plate material. In the developing device for a photosensitive printing plate precursor in JP1998-123722A (JP-H10-123722A), a developer is supplied, and the brush is brought into slide-contact with a non-exposed pattern part to perform the development. Furthermore, scraped refuse remaining on the upper surface of the photosensitive plate material after the development treatment is washed out using a rinsing liquid. The developer and the rinsing liquid after the development treatment are collected by a hopper, returned to a developer storage tank through a back filter, and reused. In Patent Document 1, the developer is regenerated by a developer regeneration unit, and a developer replenishing unit for measuring the concentration of the regenerated developer, calculating the amount of the developer for replenishment from the difference between the measured value and the set value, and adjusting the concentration of the developer to an appropriate value is provided.

SUMMARY OF THE INVENTION

In JP1998-123722A (JP-H10-123722A), the developer after development and the used rinsing liquid are recovered by one hopper. However, the developing device is configured to have the developer regeneration unit, and the device configuration is complicated. Therefore, it is not easy to reuse the developer and the rinsing liquid.

An object of the present invention is to provide a treatment device and a treatment method capable of solving the above-described problems based on the related art, easily reusing a used rinsing liquid, and reducing the amount of waste liquid.

In order to achieve the above object, according to an aspect of the present invention, provided is a treatment device having: a developing portion which is provided with a developing unit which performs development by removing a non-exposed portion of a flexographic printing plate precursor after imagewise exposure using a developer containing a washing solution; a rinsing portion which is provided with a rinsing liquid supply portion which supplies a rinsing liquid containing substantially only water as a component to at least a surface of the flexographic printing plate precursor after development, from which the non-exposed portion of the flexographic printing plate precursor has been removed; a developer storage portion which has a developer storage tank which stores the developer which is used for the development in the developing portion; a first liquid feeding path through which the developer after development is fed to the developer storage tank of the developer storage portion; and a second liquid feeding path different from the first liquid feeding path, through which the rinsing liquid supplied by the rinsing portion is fed to the developer storage tank of the developer storage portion, in which the developing portion repeatedly uses the developer stored in the developer storage tank of the developer storage portion to perform the development.

It is preferable that a developer replenishing portion which replenishes the developer storage tank of the developer storage portion with a developer having a higher chelating agent concentration than the developer stored in the developer storage tank of the developer storage portion, as a development replenishing liquid is provided.

It is preferable that an amount of the development replenishing liquid with which the developer storage tank is replenished by the developer replenishing portion is determined according to an amount of the rinsing liquid which is fed to the developer storage tank of the developer storage portion.

It is preferable that a ratio of an amount of the rinsing liquid which is fed to the developer storage tank of the developer storage portion to an amount of the development replenishing liquid is constant.

It is preferable that a total amount of the rinsing liquid which is fed to the developer storage tank of the developer storage portion and the development replenishing liquid is 10 to 30 L/m$^2$ with respect to an area of the developed flexographic printing plate precursor.

It is preferable that a control portion which detects a timing of supply of the rinsing liquid to the flexographic printing plate precursor, and causes the developer replenishing portion to supply the development replenishing liquid to the developer storage tank of the developer storage portion after supply of the rinsing liquid is provided.

It is preferable that a transport portion which transports the flexographic printing plate precursor is provided, and the rinsing portion is provided on a downstream side of the developing portion in a transport direction of the flexographic printing plate precursor.

Provided is a treatment method having: a developing step of performing development by removing a non-exposed portion of a flexographic printing plate precursor after imagewise exposure using a developer containing a washing solution; and a rinsing step of supplying a rinsing liquid containing substantially only water as a component to at least a surface of the flexographic printing plate precursor after development, from which the non-exposed portion of the flexographic printing plate precursor has been removed, in which the developer which is used for the development is fed to a developer storage tank which stores the developer via a first liquid feeding path, the rinsing liquid supplied in the rinsing step is fed to the developer storage tank via a second liquid feeding path different from the first liquid feeding path, and in the developing step, the developer stored in the developer storage tank is repeatedly used for the development.

It is preferable that a step of replenishing the developer storage tank with a developer having a higher chelating agent concentration than the developer stored in the developer storage tank, as a development replenishing liquid is provided.

It is preferable that an amount of the development replenishing liquid with which the developer storage tank is replenished is determined according to an amount of the rinsing liquid.

It is preferable that a ratio of an amount of the rinsing liquid which is fed to the developer storage tank to an amount of the development replenishing liquid is constant.

It is preferable that a total amount of the rinsing liquid which is fed to the developer storage tank and the development replenishing liquid is 10 to 30 L/m$^2$ with respect to an area of the developed flexographic printing plate precursor.

It is preferable that a timing of supply of the rinsing liquid to the flexographic printing plate precursor is detected, and after the rinsing liquid is supplied, the development replenishing liquid is supplied to the developer storage tank.

It is preferable that the flexographic printing plate precursor is transported along a transport path, and the developing step and the rinsing step are performed.

With the treatment device and the treatment method according to an aspect of the present invention, it is possible to easily reuse a used rinsing liquid and to reduce the amount of waste liquid.

DESCRIPTION OF THE PREFERRED EMBODIMENTS

Hereinafter, a treatment device and a treatment method according to an embodiment of the present invention will be described in detail based on preferable embodiments shown in the accompanying drawings.

The drawings described below are merely an example for describing the present invention, and the present invention is not limited to the drawings shown below.

In the following description, the term "to" indicating a numerical range includes numerical values described on both sides thereof. For example, in a case where ε is a numerical value α to a numerical value β, the range of a includes the numerical values α and β, which is $\alpha \le \varepsilon \le \beta$ in mathematical symbols.

Unless otherwise specified, an angle such as "vertical" or the like includes an error range generally accepted in the relevant technical field.

(Treatment System)

Figure 1:
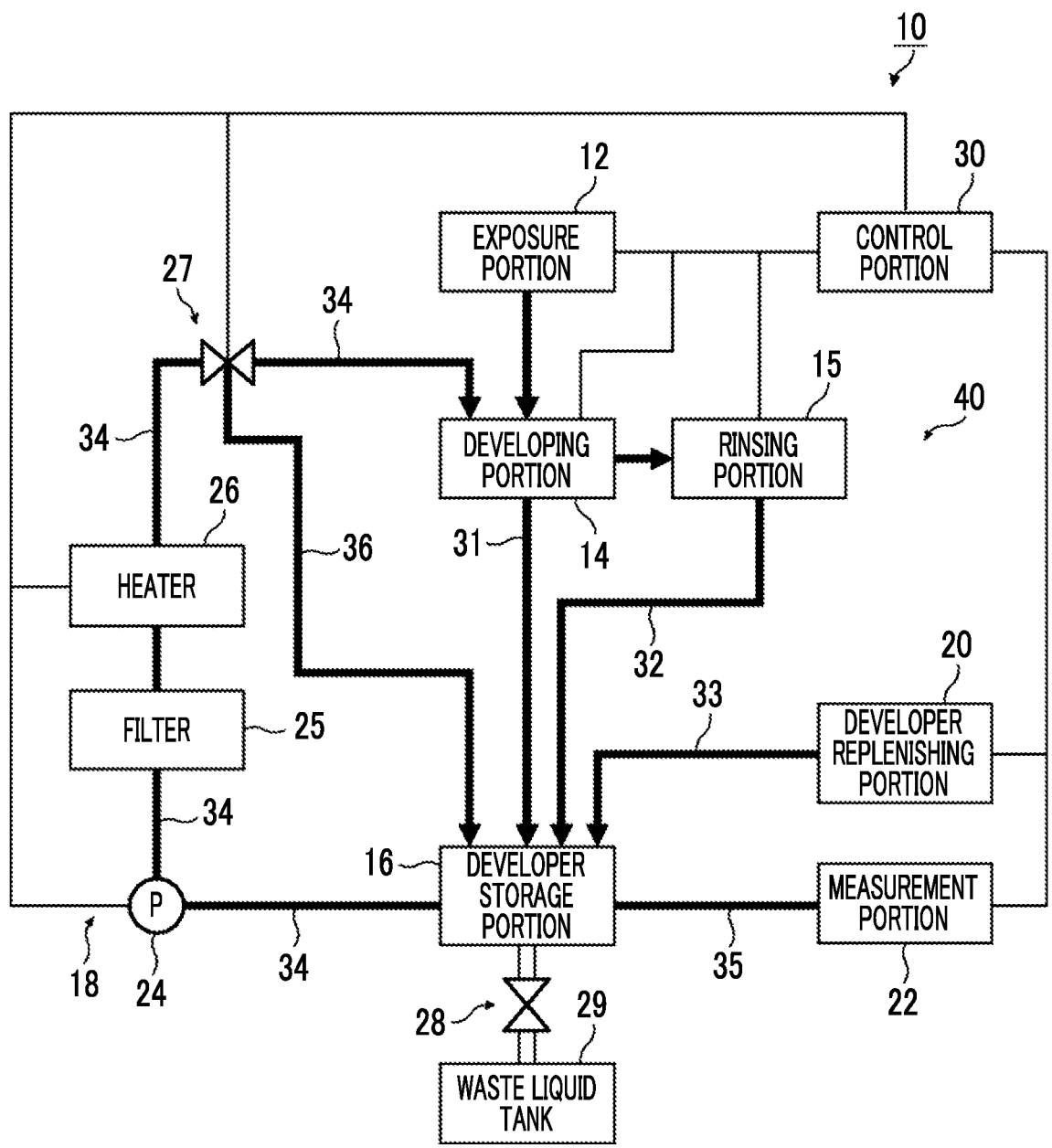
FIG. 1 is a schematic diagram showing an example of a treatment system having a treatment device according to an embodiment of the present invention.

FIG. 1 is a schematic diagram showing an example of a treatment system having a treatment device according to an embodiment of the present invention.

A treatment system 10 shown in FIG. 1 has a treatment device 40. The treatment system 10 includes an exposure portion 12, a developing portion 14, a rinsing portion 15, a developer storage portion 16, a developer supply portion 18, a developer replenishing portion 20, a measurement portion 22, a pump 24, a filter 25, a heater 26, a switching valve 27, a valve 28, a waste liquid tank 29, and a control portion 30.

The control portion 30 controls operations and the like of the constituent portions of the treatment system 10. In the treatment system 10, a configuration excluding the exposure portion 12 corresponds to the treatment device 40. That is, in the treatment system 10, a configuration without the exposure portion 12 corresponds to the treatment device 40.

The developing portion 14 is connected to the developer storage portion 16 via a first liquid feeding path 31, and a developer is fed to a developer storage tank 16a (see FIG. 2) of the developer storage portion 16. The rinsing portion 15 is connected to the developer storage portion 16 via a second liquid feeding path 32, and for example, a rinsing liquid is fed to the developer storage tank 16a of the developer storage portion 16. Each of the first liquid feeding path 31 and the second liquid feeding path 32 is composed of, for example, a pipe.

The developer storage portion 16 is connected to the developing portion 14 via a connecting pipe 34. The connecting pipe 34 is provided with the pump 24, the filter 25, the heater 26, and the switching valve 27 in the above-described order from the side closer to the developer storage portion 16.

The pump 24 feeds the developer to the developing portion 14. The configuration of the pump 24 is not particularly limited as long as it is possible to feed the developer.

The filter 25 removes solids (not shown) in a developer Q after development, and the concentration of the solids can be reduced by the filter 25. The filter 25 is not particularly limited as long as it can separate the solids (not shown) in the developer Q after development. The filter is appropriately determined by the size of the solids to be separated, and for example, a ceramic filter is used. The filter 25 is preferably capable of separating, for example, solids having a particle size of 1 μm or less.

The heater 26 is provided to adjust the liquid temperature of the liquid supplied to the developing portion 14, and the configuration of the heater is not particularly limited as long as it is possible to adjust the liquid temperature to a preset temperature. As the heater 26, for example, an in-line type heater in which a heating element is provided inside the connecting pipe 34 is used. The heater 26 is not necessarily required, and a configuration without the heater 26 may be employed.

The switching valve 27 switches the supply path of the developer. The switching valve 27 is connected to the developing portion 14 and the developer storage portion 16. The switching valve 27 is connected to the developer storage portion 16 via a connecting pipe 36. By the switching valve 27, the developer can be supplied to the developing portion 14, and returned to the developer storage portion 16. The switching valve 27 is connected to the control portion 30, and the supply destination of the developer can be changed by controlling the opening and closing of the switching valve 27. For example, a three-way valve is used as the switching valve 27.

The rinsing portion 15 includes a rinsing liquid supply portion 44 (see FIG. 2) which supplies a rinsing liquid containing substantially only water as a component.

The developer replenishing portion 20 is connected to the developer storage portion 16 via a connecting pipe 33. The developer replenishing portion 20 supplies, to the developer storage portion 16, a developer having a higher chelating agent concentration than a developer stored in the developer storage tank 16a (see FIG. 2) of the developer storage portion 16 as a development replenishing liquid.

The measurement portion 22 is connected to the developer storage portion 16 via a connecting pipe 35. The measurement portion 22 measures the concentration of solid contents of the developer. In the measurement portion 22, a set amount, for example, 10 g of the developer is put in an aluminum container and dried under conditions of a temperature of 95° C. for 12 hours. After drying, the concentration of solid contents of the developer is obtained by measuring the mass of the residues.

The concentration of solid contents is the concentration of solids generated by the removal of a non-exposed portion of a flexographic printing plate precursor after imagewise exposure.

In the treatment device 40, the measurement portion 22 is not necessarily required in a case where the concentration of solid contents of the developer can be obtained.

The exposure portion 12 exposes a flexographic printing plate precursor. The flexographic printing plate precursor exposed by the exposure portion 12 is the flexographic printing plate precursor after imagewise exposure. A surface of the flexographic printing plate precursor subjected to the imagewise exposure is a printing surface.

The configuration of the exposure portion 12 is not particularly limited as long as it is possible to expose the flexographic printing plate precursor. As the exposure portion 12, a known device capable of exposing the flexographic printing plate precursor can be appropriately used.

The developing portion 14 develops the exposed flexographic printing plate precursor, and the flexographic printing plate precursor after being exposed by the exposure portion 12 is transported.

The developing portion 14 develops the flexographic printing plate precursor after imagewise exposure using, for example, a developer containing a washing solution. The configuration of the developing portion 14 is not particularly limited as long as it is possible to develop the flexographic printing plate precursor after imagewise exposure. As the developing portion 14, a known device using an aqueous developer can be appropriately used. The developing portion 14 may have a configuration called a clamshell type that develops a flexographic printing plate precursor by a batch method, or a transport type configuration that develops a flexographic printing plate precursor while transporting the flexographic printing plate precursor. In addition, the flexographic printing plate precursor after imagewise exposure may be immersed and developed. In the clamshell type, the developing portion 14 and the rinsing portion 15 are integrated with each other.

The developer containing a washing solution means that, for example, a rinsing liquid or a development replenishing liquid is contained in addition to the washing solution. The rinsing liquid and the development replenishing liquid will be described later. In addition, the washing solution is, for example, an aqueous developer containing water as a main component.

The developer storage portion 16 has the developer storage tank 16a (see FIG. 2) which stores the developer. The developer after development is fed to the developer storage tank 16a (see FIG. 2) by the first liquid feeding path 31. In addition, the rinsing liquid used in the rinsing portion 15 is fed by the second liquid feeding path 32. The rinsing portion 15 is not limited to a portion feeding the used rinsing liquid to the developer storage portion 16, and may be configured to feed the liquid to the developer replenishing tank 16b (see FIG. 2) or the developer replenishing portion 20.

In addition, the developer which has passed through the filter 25 and the heater 26 from the developer storage tank 16a may be fed to the developer storage tank 16a via the connecting pipe 36 by the switching valve 27.

The waste liquid tank 29 stores the liquid discarded from the developer storage tank 16a of the developer storage portion 16, and for example, stores the developer unsuitable for development. The valve 28 is opened and the developer in the developer storage portion 16 is discharged to the waste liquid tank 29. Whether the developer is suitable for development may be determined using the measurement result of the measurement portion 22 or based on the developed area of the flexographic printing plate precursor.

The developer supply portion 18 has the developer storage portion 16, the pump 24, the filter 25, the heater 26, and the switching valve 27. The developer is supplied from the developer storage portion 16 which stores the developer to the developing portion 14. The developer supply portion 18 preferably has a flowmeter, but for example, in a case where the pump 24 has a function of measuring a delivery amount, the flowmeter is not required.

Next, the treatment device 40 will be described in greater detail using FIGS. 2 and 3.

First Example of Treatment Device

Figure 2:
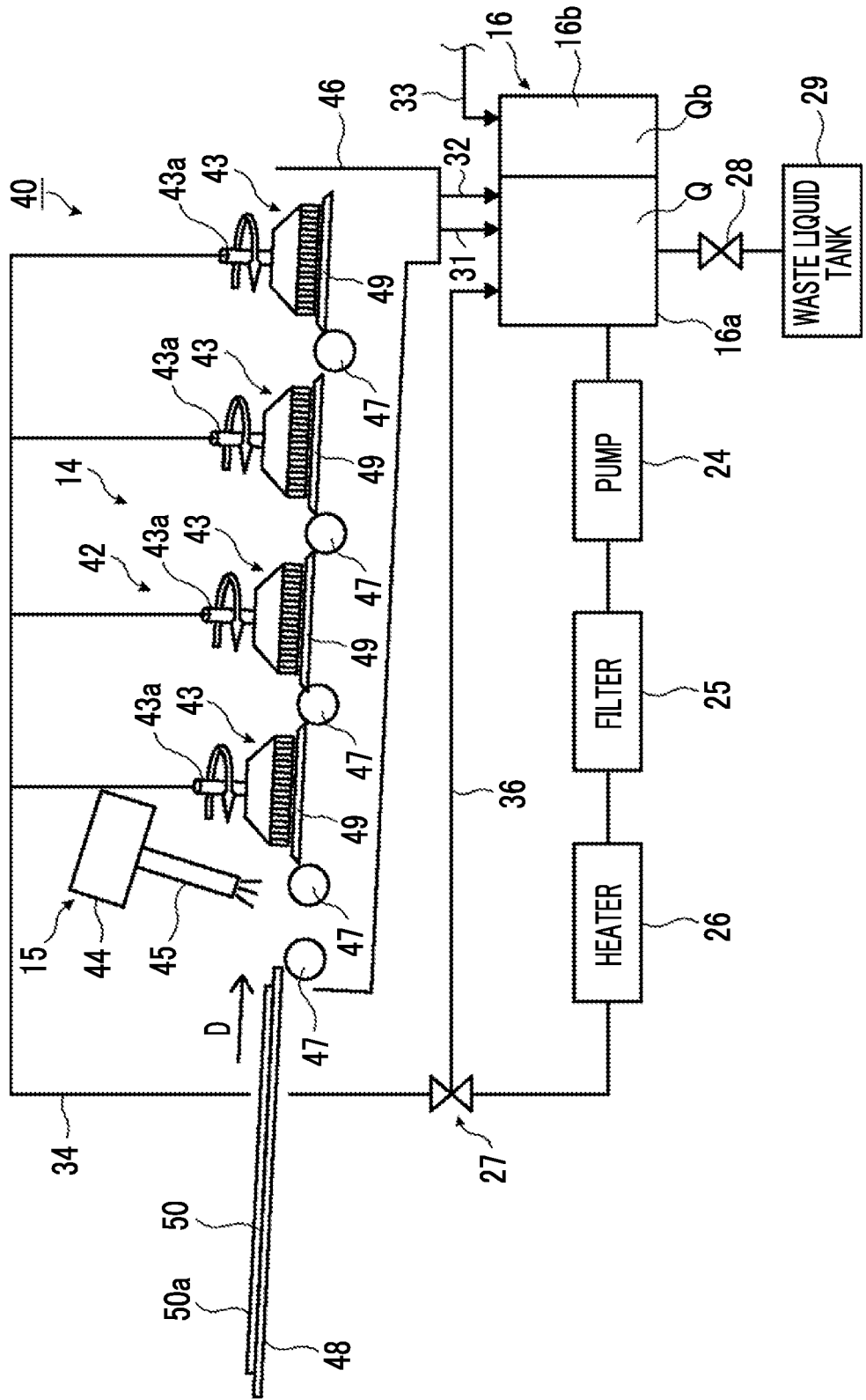
FIG. 2 is a schematic diagram showing a first example of the treatment device according to the embodiment of the present invention.
Figure 3:
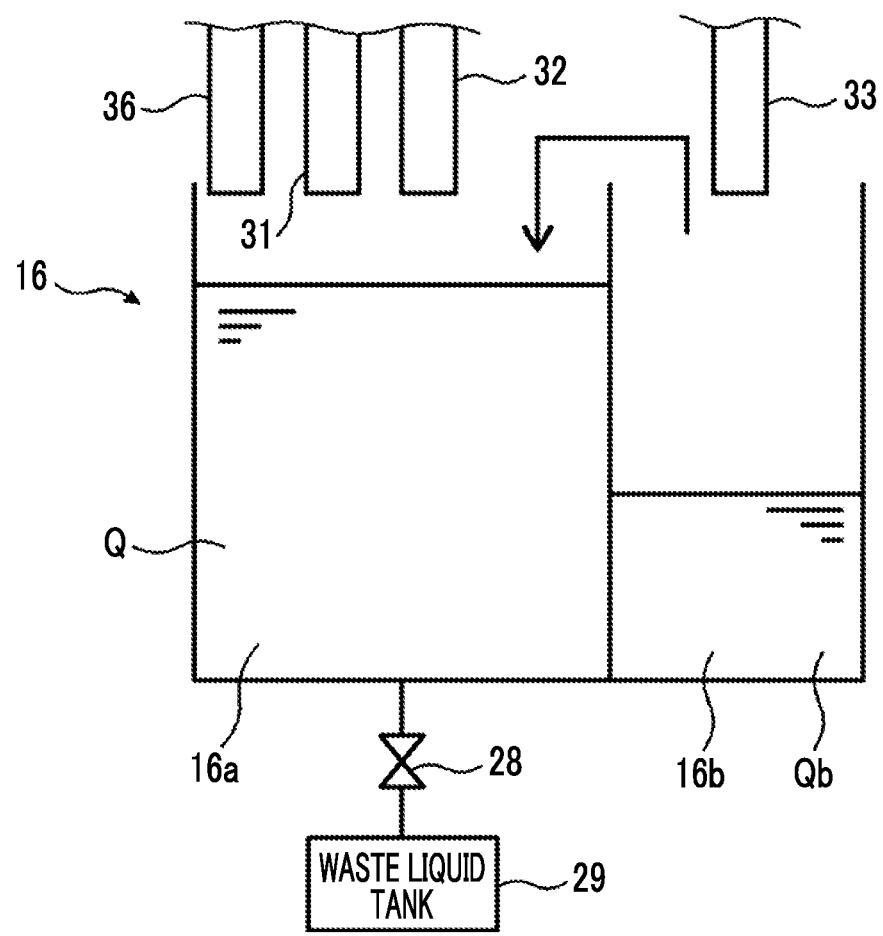
FIG. 3 is a schematic diagram showing a developer storage portion of the treatment device according to the embodiment of the present invention.

FIG. 2 is a schematic diagram showing a first example of the treatment device according to the embodiment of the present invention, and FIG. 3 is a schematic diagram showing the developer storage portion of the treatment device according to the embodiment of the present invention. In FIGS. 2 and 3, the same constituent portions as those of the treatment system shown in FIG. 1 are denoted by the same reference signs and numerals, and detailed description thereof will be omitted. In FIGS. 2 and 3, the control portion 30 is not shown.

In the treatment device 40 shown in FIG. 2, the developing portion 14 is provided with a developing unit 42 which performs development by removing a non-exposed portion of the flexographic printing plate precursor after imagewise exposure using a developer Q containing a washing solution.

The developing unit 42 is disposed in a developing tank 46. The developing unit 42 has a plurality of brushes 43.

A plurality of transport rollers 47 are provided in the developing tank 46. A support 49 which supports a flexographic printing plate precursor 50 is provided between the transport rollers 47. The brush 43 is disposed on each support 49.

In addition, a table 48 on which the flexographic printing plate precursor 50 is placed is provided adjacent to the developing tank 46. The flexographic printing plate precursor 50 is sent out from the table 48 to the transport roller 47, and the transport roller 47 transports the flexographic printing plate precursor 50 in a transport direction D. The transport roller 47 also transports the flexographic printing plate precursor 50 in a direction opposite to the transport direction D.

The plurality of brushes 43 are rotated about a rotation shaft 43a by a driving portion (not shown). In addition, a developer Q is supplied to the brush 43 via the rotation shaft 43a during development. The developer Q is supplied from the brush 43 to a surface 50a of the flexographic printing plate precursor 50.

The surfaces 50a of the flexographic printing plate precursors 50 are rubbed with the plurality of brushes 43 to remove non-exposed portions (not shown) of the flexographic printing plate precursors 50, whereby development is performed. The developer Q after development collects in the developing tank 46 and is fed to and stored in the developer storage tank 16a of the developer storage portion 16 by the first liquid feeding path 31.

As the brush 43, for example, a brush in which bristles are planted in a bundle vertical to a substrate is used. In this configuration, the bristles of the brush 43 are substantially vertical to the surface 50a of the flexographic printing plate precursor 50. The configuration of the brush 43 is not particularly limited.

In addition, the material of the bristles of the brush 43 is not particularly limited, and for example, a known material which is used for developing the flexographic printing plate precursor 50 such as nylon 6,6, nylon 610, polybutylene terephthalate (PBT), or polyethylene terephthalate (PET) can be appropriately used.

The brush 43 may be configured to be immobilized, that is, fixed with respect to the surface 50a of the flexographic printing plate precursor 50, or to be moved with respect to the surface 50a of the flexographic printing plate precursor 50. In this case, the movement of the brush 43 is not particularly limited, and may be any one of rotation, reciprocation, or a combination of rotation and reciprocation.

In a case where the brush 43 is moved, the brush 43 may be constantly moved during development, or may be moved only when the flexographic printing plate precursor 50 is transported to the developing tank 46. In this case, for example, a sensor (not shown) which detects the flexographic printing plate precursor 50 can be provided on the transport roller 47 through which the flexographic printing plate precursor 50 first passes, so that the brush 43 can be moved at a time when the flexographic printing plate precursor reaches the brush 43, specified using the transportation timing and transportation speed of the flexographic printing plate precursor 50, to perform the development.

The rinsing portion 15 has a rinsing liquid supply portion 44 which supplies a rinsing liquid. The rinsing liquid supply portion 44 has, for example, a nozzle 45, a rinsing liquid storage portion (not shown), and a pump (not shown), and supplies the rinsing liquid from the nozzle 45 to the surface 50a of the flexographic printing plate precursor 50.

The rinsing liquid is a liquid containing substantially only water as a component, and for example, fresh water, tap water, industrial water, groundwater, or the like can be used. The expression substantially only water means that water is contained in an amount of 99.50 mass % or greater as a component of the rinsing liquid. The water is preferably contained in an amount exceeding 99.99 mass %, and it is most preferable that the rinsing liquid consists only of water.

The rinsing portion 15 supplies the rinsing liquid from the rinsing liquid supply portion 44 to the surface 50a of the flexographic printing plate precursor 50, and removes residues such as latex components, rubber components, and the like remaining on the surface 50a of the flexographic printing plate precursor 50 after development using the rinsing liquid. The rinsing liquid after rinsing collects in the developing tank 46 and is fed to and stored in the developer storage tank 16a of the developer storage portion 16 via the second liquid feeding path 32. In addition, for example, the control portion 30 (see FIG. 1) causes a sensor (not shown) which detects the flexographic printing plate precursor 50 to detect a timing at which the flexographic printing plate precursor 50 passes through the brush 43 on the side of the table 48, and causes the rinsing liquid to be supplied from the rinsing liquid supply portion 44 of the rinsing portion 15 to at least the surface 50a of the flexographic printing plate precursor 50 after development, from which the non-exposed portion has been removed, through the nozzle 45.

The developer storage portion 16 has the developer storage tank 16a and the developer replenishing tank 16b. As shown in FIG. 3, a developer Q containing a washing solution is stored in the developer storage tank 16a. The developer Q is supplied to the developing unit 42 and used for development by the brush 43. The developer Q in the developer storage tank 16a is repeatedly used. In addition, a used rinsing liquid is fed to and stored in, for example, the developer storage tank 16a. In a case where the developer Q is mixed with a rinsing liquid, the rinsing liquid contains substantially only water as a component as described above, and in a case where the developer Q contains a used rinsing liquid, the concentration of the components of the developer Q is reduced. Therefore, in order to reuse the rinsing liquid, it is necessary to keep the components of the developer Q at a set concentration, and a development replenishing liquid Qb is added to the developer. From the developer replenishing portion 20 (see FIG. 1), the above-described development replenishing liquid Qb is fed to and stored in the developer replenishing tank 16b. The development replenishing liquid Qb is transferred from the developer replenishing tank 16b to the developer storage tank 16a, and the developer Q containing a rinsing liquid and the development replenishing liquid Qb are mixed. A liquid feeding portion (not shown) such as a pump is provided which feeds a liquid such as the development replenishing liquid in the developer replenishing tank 16b to the developer storage tank 1/6a.

Figure 4:
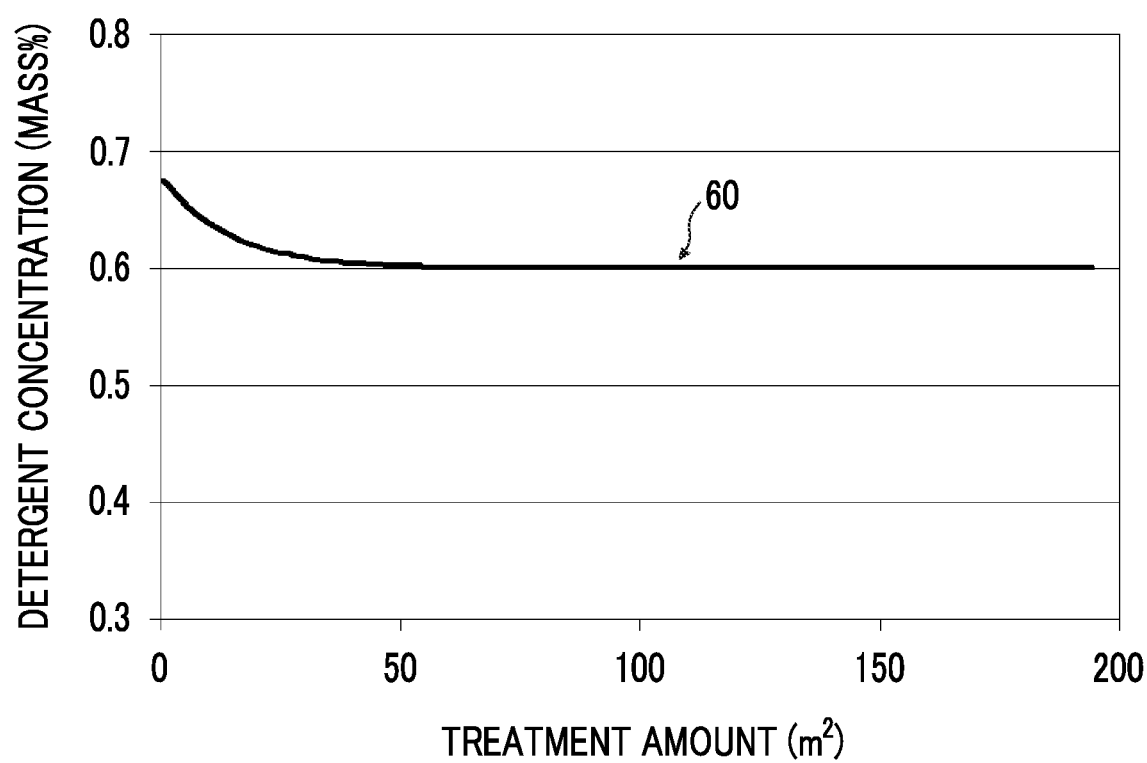
FIG. 4 is a graph showing changes in detergent concentration in a developer.

For example, by defining an amount of the rinsing liquid per unit area of the flexographic printing plate precursor and an amount of the development replenishing liquid, the concentration of a detergent in the developer Q can be kept constant as shown by a characteristic curve 60 shown in FIG. 4. For example, the amount of the rinsing liquid is 6.4 L/m$^2$, and the amount of the development replenishing liquid is 7.6 L/m². The rinsing liquid contains substantially only water as a component, and the detergent concentration therein is 0 mass %. The detergent concentration in the development replenishing liquid is 1.1 mass %. The amount of the development replenishing liquid is 14 L/m², and the detergent concentration is 0.59 mass %. In a case where the amount of the development replenishing liquid with respect to the area of the flexographic printing plate precursor 50 is 14 L/m², the detergent concentration (mass %) can be kept constant at, for example, 0.5 mass %. The detergent is a component of the developer, which contributes to the development, and is an alkaline agent, a chelating agent, a surfactant, or a mixture thereof.

In a case where the rinsing treatment is performed during the process for the treatment and the flexographic printing plate precursor 50 is washed, the rinsing liquid flows into the developer storage tank 16*a*. At this time, the developer concentration in the developer storage tank 16*a* begins to decrease, and thus the rinsing liquid is fed to the developer storage tank 16*a* in a case where the rinsing portion 15 is operated by the control portion 30. In this case, in a case where the developer replenishing portion 20 is operated by the control portion 30 to feed the development replenishing liquid Qb having a higher chelating agent concentration than the developer Q to the developer replenishing tank 16*b* and the development replenishing liquid Qb is transferred from the developer replenishing tank 16*b* to the developer storage tank 16*a*, the detergent concentration in the developer Q can be stably maintained. The rinsing liquid may be fed to the developer replenishing tank 16*b* and transferred to the developer storage tank 16*a* in a state of being mixed with the development replenishing liquid Qb.

In the treatment device 40, since the developer evaporates according to the structure of the developer storage portion 16, it is necessary to correct the amount of water evaporated. The total amount of the rinsing liquid and the development replenishing liquid is on the assumption that the evaporation amount is separately replenished. In a case where the developer evaporates, the amount of liquid waste is obtained by dividing the amount, obtained by subtracting the daily evaporation amount from the total daily amount of the rinsing liquid and the development replenishing liquid, by the plate area treated for one day.

For example, the treatment amount in a case where 20 flexographic printing plate precursors having an area of 0.48 m² are treated for one day is 9.6 m²/day. Here, it is assumed that 200 liters of a developer which has not been used for development is stored in the developer storage tank 16*a*. In a case where the evaporation amount of the developer is 16.1 L/day, the feeding amount of the used rinsing liquid is 66 L/day, and the amount of the development replenishing liquid is 74 L/day, the balance of the developer storage tank 16*a* is indicated by 66+74=X+16.1 where X is the amount of waste liquid (X L/day), and the amount X of waste liquid is 123.9 L/day. The amount of waste liquid is 12.9 L/m² in terms of unit area. The amount of waste liquid can be reduced as compared to a case where 200 L of the developer is completely discarded.

Even in a case where the treatment of 20 flexographic printing plate precursors having an area of 0.48 m² per day is continuously performed for 35 days, the concentration of solid contents in the developer storage tank 16*a* is stable and is maintained at about 4 mass %. Moreover, it is possible to realize a stable treatment without the generation of debris pieces.

For example, in a case where all the developer is discarded at the time the concentration of solid contents in the developer in the developer storage tank 16*a* exceeds a set concentration or a set treatment area of the flexographic printing plate precursor 50, the amount of waste liquid increases. In addition, it is necessary to wash the developer storage tank 16*a* after discarding of the developer for each set treatment area of the flexographic printing plate precursor 50, and in a case where all the developer is discarded, the maintainability deteriorates, and the operating rate of the treatment device is also reduced.

Figure 5:
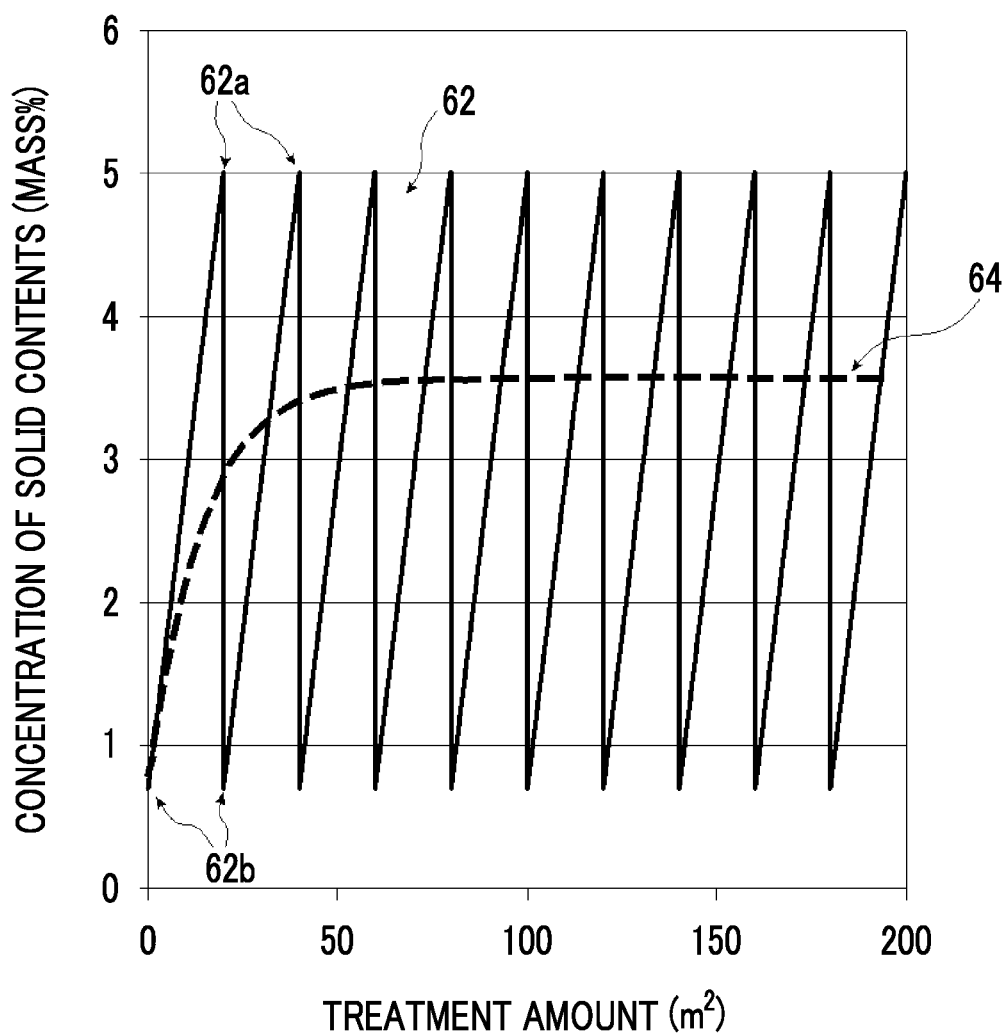
FIG. 5 is a graph showing changes in concentration of solid contents in the developer.

For example, in a case where the concentration of solid contents in the developer is 5 mass % and the developer is thus replaced, in a characteristic line 62 showing changes in concentration of solid contents (mass %) in the related art as shown in FIG. 5, the developer is replaced after the characteristic curve reaches a developer replacement timing 62*a*. The concentration of solid contents is low at an initial timing 62*b*. Meanwhile, in the treatment device, for example, without the replacement of the developer, the concentration of solid contents does not exceed a certain value without reaching 5% as shown by a characteristic curve 64 of the concentration of solid contents of the developer. In a case where the concentration of solid contents is greater than 5 mass %, a decrease in treatment quality, such as the generation of so-called white debris pieces which are precipitates of the photosensitive layer adhering to the plate face, occurs, and thus the developer is replaced at the time the concentration of solid contents reaches 5 mass %. Accordingly, it is necessary to set the amounts of the development replenishing liquid and the rinse water reuse liquid so that the equilibrium concentration of the concentration of solid contents in the developer can be maintained at 5 mass % or less, preferably 4 mass % or less.

In a case where the replenishment is not performed, the concentration of solid contents in the developer increases without saturation as shown by the characteristic line 62. It is necessary to maintain the treatment quality by replacing the developer with a new liquid in a concentration range in which the treatment quality does not deteriorate. It is required to perform a complicated liquid replacement operation every time when a fixed amount is treated, and the treatment device 40 cannot be operated during the liquid replacement operation, so that the operating rate of the treatment device 40 is reduced. In addition, a considerable amount of waste liquid is generated, including the interior washing water accompanying the liquid replacement.

Second Example of Treatment Device

Figure 6:
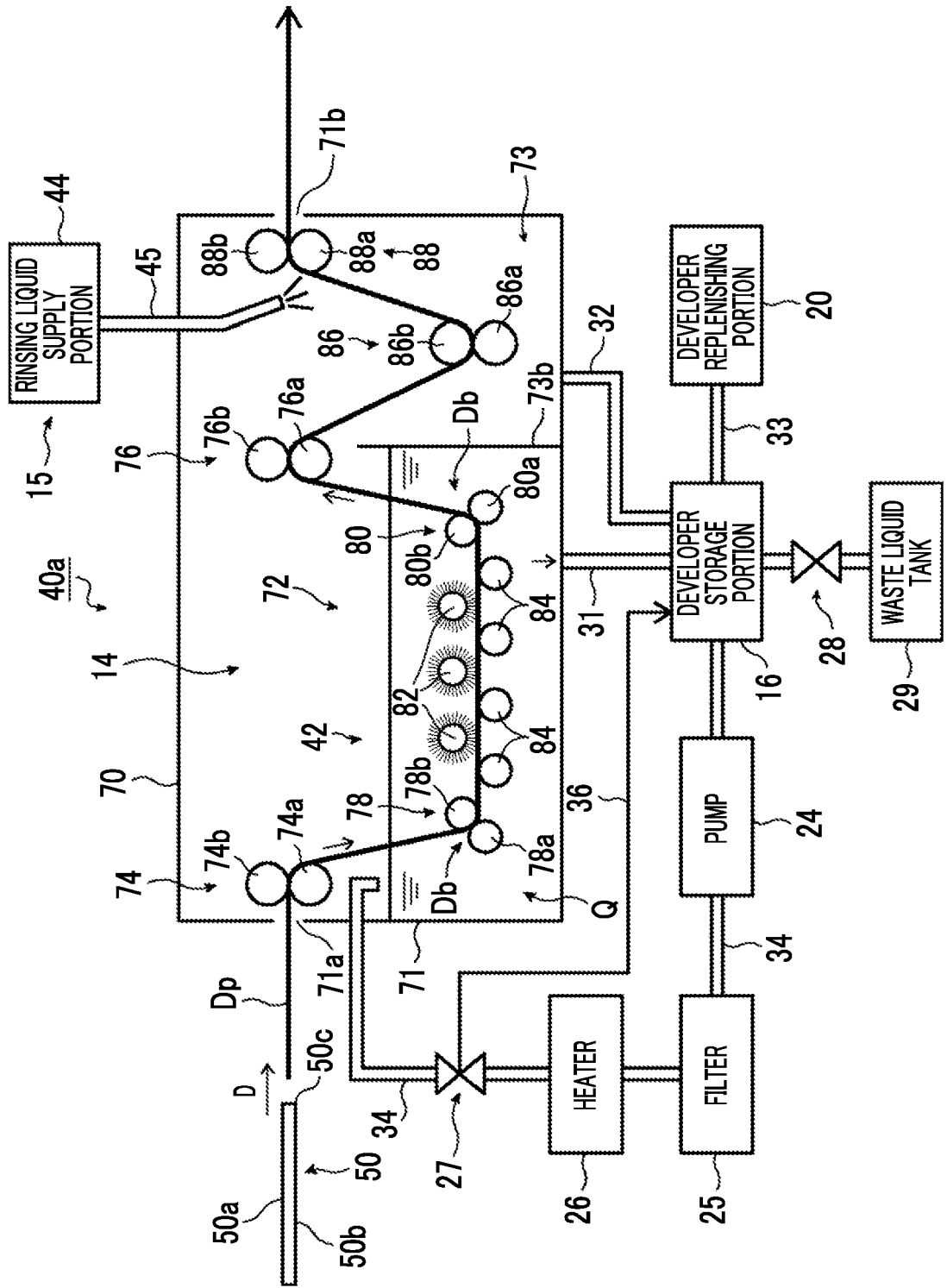
FIG. 6 is a schematic diagram showing a second example of the treatment device according to the embodiment of the present invention.

FIG. 6 is a schematic diagram showing a second example of the treatment device according to the embodiment of the present invention. In FIG. 6, the same constituent portions as those of the treatment system 10 shown in FIG. 1 are denoted by the same reference signs and numerals, and detailed description thereof will be omitted.

Using a developer Q, a treatment device 40*a* shown in FIG. 6 develops a flexographic printing plate precursor 50 after imagewise exposure with a surface 50*a* subjected to the imagewise exposure. Performing the development using a developer Q is called a developing step. The reference sign Dp in FIG. 6 denotes a transport path of the flexographic printing plate precursor 50.

As will be described later, the flexographic printing plate precursor 50 has a small thickness of about several millimeters, and has such flexibility that it can meander and can be transported in a developing tank 71. In addition, the imagewise exposure to the surface 50a of the flexographic printing plate precursor 50 is performed using an exposure portion 12 (see FIG. 1).

In the treatment device 40a, a non-exposed portion (not shown) of the flexographic printing plate precursor 50 is removed from the flexographic printing plate precursor 50 after imagewise exposure which is in a state of being immersed in the developer Q and transported, so that development is performed. The treatment device 40a is a sheet type device which performs development while transporting the flexographic printing plate precursor 50, instead of development by batch processing.

The treatment device 40a has a developing portion 14 and a rinsing portion 15. For example, the developing portion 14 and the rinsing portion 15 are provided side by side in one housing 70. The developing portion 14 is disposed on the side of an inlet 71a side of the housing 70, and the rinsing portion 15 is disposed on the side of an outlet 71b of the housing 70.

The developing tank 71 and a rinsing tank 73 are provided adjacent to each other. A side wall 73b of the rinsing tank 73 is formed higher than a liquid level of the developer Q in the developing tank 71 so that the developer in the developing tank 71 does not enter the rinsing tank 73.

The developing portion 14 of the treatment device 40a has the developing tank 71 and a transport portion 72 which transports the flexographic printing plate precursor 50 through a transport path Dp including a curved transport passage db. The developing tank 71 is a container in which the developer Q is stored.

In the treatment device 40a, the transport portion 72 which transports the flexographic printing plate precursor 50 is provided, and the rinsing portion 15 is provided on the downstream side of the developing portion 14 in a transport direction D of the flexographic printing plate precursor 50. In a treatment method, the flexographic printing plate precursor is transported along the transport path Dp, and a developing step and a rinsing step are performed.

The transport portion 72 transports the flexographic printing plate precursor 50 through the transport path Dp including the transport passage Db curved as described above, and has a first transport roller pair 74 disposed on the upstream side in the transport direction D in which the flexographic printing plate precursor 50 is transported, and a second transport roller pair 76 disposed on the downstream side in the transport direction D. For example, the first transport roller pair 74 and the second transport roller pair 76 are provided at the same height above the developing tank 71.

The flexographic printing plate precursor 50 is transported by the transport portion 72 in a state of being immersed in the developer Q in the developing tank 71.

The upstream side in the transport direction D is the side of the inlet 71a of the housing 70, and the downstream side in the transport direction D is the side of the outlet 71b of the housing 70.

The first transport roller pair 74 has a roller 74a disposed on the side of a back surface 50b of the flexographic printing plate precursor 50 and a roller 74b disposed on the side of a front surface 50a of the flexographic printing plate precursor 50, and transports the flexographic printing plate precursor 50 by sandwiching it between the rollers. One of the above-described rollers 74a and 74b is a driving roller, and the other is a driven roller.

As in the case of the first transport roller pair 74, the second transport roller pair 76 has a roller 76a disposed on the side of the back surface 50b of the flexographic printing plate precursor 50 and a roller 76b disposed on the side of the front surface 50a of the flexographic printing plate precursor 50, and transports the flexographic printing plate precursor 50 by sandwiching it between the rollers. One of the rollers 76a and 76b is a driving roller, and the other is a driven roller.

In the transport portion 72, a transport roller pair 78 and a transport roller pair 80 are disposed with an interval therebetween between the first transport roller pair 74 and the second transport roller pair 76 and in the developing tank 71. The flexographic printing plate precursor 50 is transported substantially horizontally in the developing tank 71. In the developing tank 71, the transport path Dp is linear.

A developing unit 42 has, for example, three roller-shaped brushes 82 which are brought into contact with the surface 50a of the flexographic printing plate precursor 50 and disposed with intervals therebetween. In addition, a plurality of guide rollers 84 are disposed to face the roller-shaped brushes 82 with the flexographic printing plate precursor 50 sandwiched therebetween. In a case where the flexographic printing plate precursor 50 is transported, the non-exposed portion is removed by the brushes 82.

The treatment device 40a can develop the flexographic printing plate precursor 50 in the same manner as in the case of the treatment device 40 shown in FIG. 2.

Even in the treatment device 40a, since the flexographic printing plate precursor 50 is transported by being sandwiched between the brushes 82 and the guide rollers 84, the non-exposed portion can be efficiently removed, and the flexographic printing plate precursor 50 can be more stably transported.

The roller-shaped brush 82 has bristles planted in a bundle radially with respect to an axis. As the bristles of the brush 82, the same bristles as those of the brush 43 described above can be used.

The number of brushes 82 and the number of guide rollers 84 are appropriately determined by the size of the developing tank 71, the size of the flexographic printing plate precursor 50, and the like.

As the guide roller 84, for example, a rubber roller, a sponge roller, or the like is preferably used in order not to damage the printing surface, that is, the surface 50s of the flexographic printing plate precursor 50.

The roller transport method has been taken as an example to describe the transport portion 72, but the present invention is not limited thereto. For the transport portion 72, for example, at least one of a belt transport method, the above-described roller transport method, a gear transport method, or a guide transport method can be used.

In the belt transport method, for example, in the treatment device 40a shown in FIG. 6, an endless belt (not shown) is disposed in place of the guide roller 84, and is driven by a driving portion (not shown) to transport a flexographic printing plate precursor 50.

In the gear transport method, for example, a holding device (not shown) provided with gears at both ends thereof for transporting a flexographic printing plate precursor 50 (not shown) is attached at an end portion 50c (see FIG. 6) of the flexographic printing plate precursor 50. The flexographic printing plate precursor 50 is transported by engaging the gears of the holding device with driving gears and rotating the driving gears. A ball spline gear can also be used for the gear transport method.

In the guide transport method, for example, a strip-shaped member (not shown) for transporting a flexographic printing plate precursor 50 is attached to the end portion 50c (see FIG. 6) of the flexographic printing plate precursor 50, and the flexographic printing plate precursor 50 is transported by, for example, winding up the strip-shaped member outside the outlet 71b through the outlet 71b of the housing 70.

By the rinsing portion 15, for example, a rinsing liquid is supplied in the form of spray from a rinsing liquid supply portion 44 to the surface 50a of the flexographic printing plate precursor 50 after development through a nozzle 45 between transport roller pairs 86 and 88, and the surface 50a of the flexographic printing plate precursor 50 is thus rinsed and the above-described residues are washed out. The rinsing liquid from the nozzle 45 collects in the rinsing tank 73.

The above-described transport roller pair 86 has a roller 86a disposed on the side of the back surface 50b of the flexographic printing plate precursor 50 and a roller 86b disposed on the side of the front surface 50a of the flexographic printing plate precursor 50, and transports the flexographic printing plate precursor 50 by sandwiching it between the rollers.

The transport roller pair 88 has a roller 88a disposed on the side of the back surface 50b of the flexographic printing plate precursor 50 and a roller 88b disposed on the side of the front surface 50a of the flexographic printing plate precursor 50, and transports the flexographic printing plate precursor 50 by sandwiching it between the rollers.

The above-described rollers 86a and 86b are both, for example, driven rollers. In addition, for example, one of the rollers 88a and 88b is a driving roller, and the other is a driven roller.

Even in the treatment device 40a, since the flexographic printing plate precursor 50 is transported by being sandwiched between the brushes 82 and the guide rollers 84, the non-exposed portion can be efficiently removed, and the flexographic printing plate precursor 50 can be more stably transported.

The number of brushes 82 and the number of guide rollers 84 are appropriately determined by the size of the developing tank 71, the size of the flexographic printing plate precursor 50, and the like.

(Flexographic Printing Plate Precursor)

In addition, the flexographic printing plate precursor 50 forms a flexographic printing plate to be used for flexographic printing, and its configuration is not particularly limited. The flexographic printing plate precursor 50 is preferably called a water developable flexographic printing plate precursor which can be developed with an aqueous developer containing water as a main component. As the flexographic printing plate precursor 50, a known flexographic printing plate precursor which can be developed with an aqueous developer can be used. The flexographic printing plate precursor 50 may be a flexographic plate material corresponding to computer-to-plate (CTP) which has a black layer coated on a surface thereof.

(Treatment Method)

Next, the treatment method will be described using the treatment device 40 shown in FIG. 2. The treatment method is not limited to using the treatment device 40 shown in FIG. 2. For example, the treatment device 40a shown in FIG. 6 can also be used.

In the treatment method using the treatment device 40, a flexographic printing plate precursor 50 after imagewise exposure is subjected to the development treatment and the rinsing treatment. A washing solution is previously stored as a developer in the developer storage tank 16a.

In the treatment system 10 shown in FIG. 1, the exposure portion 12 exposes a surface 50a (see FIG. 2) of the flexographic printing plate precursor 50 (see FIG. 2) with a specific pattern, for example. Accordingly, a flexographic printing plate precursor 50 (see FIG. 2) after imagewise exposure is obtained.

Next, the flexographic printing plate precursor 50 (see FIG. 2) after imagewise exposure is fed from the table 48 to the transport roller 47, transported in the transport direction D by the transport roller 47, and transported to the developing portion 14. In the developing portion 14, the developer in the developer storage tank 16a of the developer storage portion 16 is supplied to the brushes 43 of the developing unit 42 by the pump 24 through the filter 25 and the heater 26. The brushes 43 are rotated with the supply of the developer and a non-exposed portion of the flexographic printing plate precursor 50 is removed, so that development is performed. The step of performing development by removing the non-exposed portion of the flexographic printing plate precursor after imagewise exposure using a developer containing a washing solution is called a developing step. The developer after development generated by the developing step is fed to the developer storage tank 16a via the first liquid feeding path 31.

By the development treatment using a developer Q of the developing unit 42, the non-exposed portion of the flexographic printing plate precursor 50 after imagewise exposure is removed, and the generated solids are dispersed in the developer Q. Accordingly, the developer Q contains the solids derived from the flexographic printing plate precursor 50.

After the flexographic printing plate precursor 50 is developed, the flexographic printing plate precursor 50 is transported in a direction opposite to the transport direction D by the transport roller 47, and transported toward the table 48. In this case, at a time when the flexographic printing plate precursor 50 passes through the brush 43 on the side of the table 48, a rinsing liquid is supplied from the rinsing liquid supply portion 44 of the rinsing portion 15 to at least the surface 50a of the flexographic printing plate precursor 50 after development, from which the non-exposed portion has been removed, through the nozzle 45. Accordingly, residues such as latex components, rubber components, and the like remaining on the surface 50a of the flexographic printing plate precursor 50 after development are removed. The used rinsing liquid is fed to the developer storage tank 16a via the second liquid feeding path 32. The step of supplying a rinsing liquid containing substantially only water as a component to at least the surface of the flexographic printing plate precursor after development, from which the non-exposed portion of the flexographic printing plate precursor has been removed, is called a rinsing step.

The developer stored in the developer storage tank 16a of the developer storage portion 16 is a mixture of: a washing solution initially stored in a case where the development treatment is performed; a washing solution after development; and a used rinsing liquid. In the developing step, in a case where the developer stored in the developer storage tank and repeatedly used for development is in a mixed state as described above, the concentrations of various components are lowered by the rinsing liquid, and the developer may not exhibit the performance thereof so as not to be able to disperse the removed non-exposed portion. Therefore, for example, the developer storage tank is replenished with a developer having a higher chelating agent concentration than the developer stored in the developer storage tank 16a, as a development replenishing liquid. Accordingly, it is possible to maintain the performance of the developer. In this case, the above-described development replenishing liquid is fed from the developer replenishing portion 20 (see FIG. 1) to the developer replenishing tank. 16b. In addition, the rinsing liquid is fed to the developer storage tank 16a or the developer replenishing tank 16b. The development replenishing liquid stored in the developer replenishing tank 16b or the mixed liquid of the development replenishing liquid and the rinsing liquid is fed to the developer storage tank 16a, and the concentrations of the components in the developer are maintained.

In addition, as described above, since it is not necessary to discard all the developer, the maintainability is improved, and it is possible to suppress a reduction in operating rate of the treatment device.

The amount of the development replenishing liquid with which the developer storage tank is replenished is determined according to the amount of the rinsing liquid. The amount of the development replenishing liquid can be determined so that in a state in which the rinsing liquid contains substantially only water as a component, and the rinsing liquid and the development replenishing liquid are mixed, the concentrations of the components in the washing solution stored before development are reached.

In addition, the ratio of the amount of the rinsing liquid which is fed to the developer storage tank to the amount of the development replenishing liquid is preferably constant. As described above, since the amount of the development replenishing liquid is determined so that in a state in which the rinsing liquid and the development replenishing liquid are mixed, the set concentrations of the components are reached, the amount of the development replenishing liquid can be determined in a case where the amount of the rinsing liquid can be specified. Therefore, even in a case where the amount of the rinsing liquid changes, the concentrations of the components in the developer can be maintained by changing the amount of the development replenishing liquid according to the amount of the rinsing liquid.

In the treatment device, although all the developer is not discarded, a part of the developer is discarded. Therefore, the amount of waste liquid increases in a case where the amount of the rinsing liquid which is fed to the developer storage tank 16a increases. In order to reduce the amount of waste liquid, the total amount of the rinsing liquid which is fed to the developer storage tank and the development replenishing liquid is preferably 10 to 30 $L/m^2$, and more preferably 12 to 25 $L/m^2$ with respect to the area of the developed flexographic printing plate precursor. For example, as shown in FIGS. 4 and 5, in a case where the total amount of the rinsing liquid and the development replenishing liquid is 14 $L/m^2$, the concentrations of the components in the developer do not reach a concentration at which the replacement is required, and it is possible to perform the development for a long period of time.

In order to suppress variations in components in the developer, it is necessary to supply the rinsing liquid and the development replenishing liquid to the developer in the developer storage tank 16a for each treatment of the flexographic printing plate precursor 50. For example, in a case where the area of a maximum-size flexographic printing plate precursor 50 which can be treated is about 0.5 $m^2$, it is necessary to perform the treatment so that the input amount of the rinsing liquid and the development replenishing liquid is 5 to 15 liters every time when one flexographic printing plate precursor 50 is treated.

It is preferable that a timing of supply of the rinsing liquid to the flexographic printing plate precursor is detected, and after the rinsing liquid is supplied, the development replenishing liquid is supplied to the developer storage tank. Accordingly, the components in the developer in the developer storage tank 16a can be made constant.

The treatment method using the treatment device 40a shown in FIG. 6 is the same as the treatment method using the treatment device 40, except that the transport path Dp is different from that in the treatment device 40 shown in FIG. 2, and the flexographic printing plate precursor is transported along the transport path Dp to perform the developing step and the rinsing step. In the treatment method of the treatment device 40a, the non-exposed portion (not shown) of the flexographic printing plate precursor 50 is removed in a state in which the flexographic printing plate precursor is immersed in the developer Q and transported, so that development is performed. For example, by supplying a rinsing liquid in the form of spray from the rinsing liquid supply portion 44 to the surface 50a of the flexographic printing plate precursor 50 after development through the nozzle 45, the above-described residues are washed out.

The treatment method of the treatment device 40a can obtain the same effect as the treatment method of the treatment device 40a.

Hereinafter, the washing solution contained in the developer will be described.

<Washing Solution>

The washing solution is preferably an aqueous washing solution, and may be a liquid consisting only of water or an aqueous solution containing 50 mass % or greater of water and having a water-soluble compound added thereto. Examples of the water-soluble compound include a surfactant, an acid, and an alkali. The washing solution also contains a chelating agent. The above-described aqueous washing solution is equivalent to an aqueous developer.

Examples of the surfactant include an anionic surfactant, a nonionic surfactant, a cationic surfactant, and an amphoteric surfactant, and among these, an anionic surfactant is preferable.

Specific examples of the anionic surfactants include aliphatic carboxylates such as sodium laurate and sodium oleate; higher alcohol sulfates such as sodium lauryl sulfate, sodium cetyl sulfate, and sodium oleyl sulfate; polyoxyethylene alkyl ether sulfates such as sodium polyoxyethylene lauryl ether sulfate; polyoxyethylene alkyl allyl ether sulfates such as sodium polyoxyethylene octyl phenyl ether sulfate and sodium polyoxyethylene nonyl phenyl ether sulfate; alkyl sulfonates such as alkyl diphenyl ether disulfonate, sodium dodecyl sulfonate, and sodium dialkyl sulfosuccinate; alkyl allyl sulfonates such as alkyl disulfonate, sodium dodecyl benzene sulfonate, sodium dibutyl naphthalene sulfonate, and sodium triisopropyl naphthalene sulfonate; higher alcohol phosphates such as disodium lauryl phosphate monoester and sodium lauryl phosphate diester; and polyoxyethylene alkyl ether phosphates such as disodium polyoxyethylene lauryl ether phosphate monoester and sodium polyoxyethylene lauryl ether phosphate diester. These may be used alone or in combination of two or more thereof. Sodium salts have been exemplified as specific examples, but the anionic surfactant is not particularly limited to sodium salts. The same effect can be obtained even in a case where the anionic surfactant is a calcium salt, an ammonium salt, or the like.

Specific examples of the nonionic surfactant include alkaline salt compounds, such as polyoxyethylene alkyl ethers such as polyoxyethylene oleyl ether and polyoxyethylene lauryl ether, polyoxyethylene polyoxypropylene glycols such as polyoxyethylene alkyl phenyl ether such as polyoxyethylene nonyl phenyl ether and polyoxyethylene octyl phenyl ether, mono- and diesters of an aliphatic acid and polyethylene glycol such as polyethylene glycol monostearate, polyethylene glycol monoolate, and polyethylene glycol dilaurate, esters of an aliphatic acid and sorbitan such as sorbitan monolaurate and sorbitan monooleate, esters of a polyoxyethylene adduct of sorbitan and an aliphatic acid such as polyoxyethylene sorbitan monolaurate, polyoxyethylene sorbitan monostearate, and polyoxyethylene sorbitan trilaurate, esters of an aliphatic acid and sorbit such as sorbit monopalmitate and sorbit dilaurate, esters of a polyoxyethylene adduct of sorbit and an aliphatic acid such as polyoxyethylene sorbit monostearate and polyoxyethylene sorbit diolate, esters of an aliphatic acid and pentaerythritol such as pentaerythritol monostearate, esters of an aliphatic acid and glycerin such as glycerin monolaurate, aliphatic acid alkanolamides such as lauric acid diethanolamide and lauric acid monoethanolamide; amine oxides such as lauryldimethylamine oxide, aliphatic acid alkanolamines such as stearyl diethanolamine, polyoxyethylene alkylamines, triethanolamine aliphatic acid esters, phosphates, carbonates, and silicates. These may be used alone or in combination of two or more thereof.

Specific examples of the cationic surfactant include primary, secondary, and tertiary amine salts such as monostearyl ammonium chloride, distearyl ammonium chloride, and tristearyl ammonium chloride, quaternary ammonium salts such as stearyl trimethyl ammonium chloride, distearyl dimethyl ammonium chloride, and stearyl dimethyl benzyl ammonium chloride, alkyl pyridinium salts such as N-cetyl pyridinium chloride and N-stearyl pyridinium chloride, N,N dialkyl morpholinium salts, aliphatic acid amide salts of polyethylene polyamine, acetate salts of an urea compound of amides of aminoethyl ethanolamine and stearic acid, and 2-alkyl-1-hydroxyethyl imidazolinium chloride. These may be used alone or in combination of two or more thereof.

Specific examples of the amphoteric surfactant include amino acid type surfactants such as sodium laurylamine propionate, carboxy betaine type surfactants such as lauryl dimethyl betaine and lauryl dihydroxyethyl betaine, sulfobetaine type surfactants such as stearyl dimethyl sulfoethylene ammonium betaine, imidazolinium betaine type surfactants, and lecithin. These may be used alone or in combination of two or more thereof.

Specific examples of the acid include inorganic acids or organic acids such as a hydrochloric acid, a sulfuric acid, a nitric acid, a phosphoric acid, a formic acid, an acetic acid, an oxalic acid, a succinic acid, a citric acid, a malic acid, a maleic acid, and a p-toluenesulfonic acid.

Specific examples of the alkali include lithium hydroxide, sodium hydroxide, magnesium hydroxide, potassium hydroxide, calcium hydroxide, calcium oxide, sodium carbonate, sodium hydrogen carbonate, and calcium carbonate.

Specific examples of the chelating agent, that is, a sequestering agent include a citric acid, an ethylenediaminetetraacetic acid (EDTA), an ethylenediamine-N,N'-disuccinic acid (EDDS), a L-glutamate diacetic acid (GLDA), and alkali metal salts thereof.

Hereinafter, the washing solution after development, that is, the fatigued developer will be described in detail. In a case where the developer is repeatedly used, the fatigued developer is fed to the developer storage tank.

<Fatigued Developer>

The fatigued developer is a washing solution containing solids generated by the removal of the non-exposed portion of the flexographic printing plate precursor after imagewise exposure. In the washing solution containing solids, the expression containing solids means a state in which the solids are dissolved or dispersed.

The fatigued developer is not particularly limited as long as it is a washing solution containing solids generated by the removal of the non-exposed portion of the flexographic printing plate precursor by development using the above-described washing solution, that is, a washing solution containing an uncured resin. It may also include a fatigued developer containing a known photosensitive resin composition of the related art for forming a general photosensitive resin layer.

The uncured resin removed by development may be a photosensitive resin contained in a photosensitive resin composition.

In addition, a treatment subject is preferably a fatigued developer generated from development using a laser ablation masking (LAM) method, and thus the uncured resin removed by development is preferably a photosensitive resin contained in a photosensitive resin composition.

In addition, examples of such a photosensitive resin composition include compositions containing, in addition to the photosensitive resin, for example, a polymerization initiator, a polymerizable compound, a polymerization inhibitor, a plasticizer, or the like, and thus the fatigued developer may contain, in addition to an uncured resin, a polymerization initiator, a polymerizable compound, a polymerization inhibitor, a plasticizer, or the like.

<Uncured Resin>

The uncured resin contained in the fatigued developer refers to solids generated by the removal of the non-exposed portion. Examples of the uncured resin contained in the fatigued developer include a water-dispersible latex, a rubber component, a polymer component, and an uncrosslinked ethylenically unsaturated compound (polymer).

Examples of the water-dispersible latex include water-dispersible latex polymers of a water-dispersible latex or the like such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinylpyridine copolymer latex, butyl polymer latex, thiokol polymer latex, and acrylate polymer latex, and polymers obtained by copolymerizing the above-described polymer and another component such as an acrylic acid or a methacrylic acid.

Examples of the rubber component include butadiene rubber, isoprene rubber, styrene-butadiene rubber, acrylonitrile rubber, acrylonitrile butadiene rubber, chloroprene rubber, polyurethane rubber, silicon rubber, butyl rubber, ethylene-propylene rubber, and epichlorohydrin rubber.

Examples of the polymer component may be hydrophilic or hydrophobic, and specific examples thereof include a polyamide resin, an unsaturated polyester resin, an acrylic resin, a polyurethane resin, a polyester resin, and a polyvinyl alcohol resin.

Solids having a smaller specific gravity than the washing solution are, for example, a photosensitive resin such as a rubber component or latex.

Solids having a larger specific gravity than the washing solution are, for example, a component of an overcoat layer such as carbon.

Examples of the ethylenically unsaturated compound (polymer) include (meth)acrylic-modified polymers having an ethylenically unsaturated bond in the molecule.

Examples of the (meth)acrylic-modified polymers include (meth)acrylic-modified butadiene rubber and (meth)acrylic-modified nitrile rubber.

"(Meth)acryl" is an expression representing acryl or methacryl, and "(meth)acrylate" to be described later is an expression representing an acrylate or a methacrylate.

The uncured resin included in the fatigued developer is not particularly limited, and is preferably 70 mass % or less, and more preferably 35 mass % or less.

<Polymerization Initiator>

The polymerization initiator which may be contained in the fatigued developer is preferably a photopolymerization initiator.

Examples of the above-described photopolymerization initiator include alkylphenones, acetophenones, benzoin ethers, benzophenones, thioxanthones, anthraquinones, benzyls, and biacetyls, and among these, alkylphenones are preferable.

Specific examples of the alkylphenone photopolymerization initiators include 2,2-dimethoxy-1,2-diphenylethane-1-one, 1-hydroxy-cyclohexyl-phenyl-ketone, and 2-hydroxy-2-methyl-1-phenyl-propane-1-one.

The concentration of the polymerization initiator which may be contained in the fatigued developer is not particularly limited, and is preferably 2.0 mass % or less, and more preferably 1.0 mass % or less.

<Polymerizable Compound>

Examples of the polymerizable compound which may be contained in the fatigued developer include ethylenically unsaturated compounds corresponding to so-called monomer components other than the above-described ethylenically unsaturated compound (polymer).

The ethylenically unsaturated compound may be a compound having one ethylenically unsaturated bond or a compound having two or more ethylenically unsaturated bonds.

Specific examples of the compound having one ethylenically unsaturated bond include (meth)acrylates having a hydroxyl group such as 2-hydroxyethyl (meth)acrylate, 2-hydroxypropyl (meth)acrylate, 2-hydroxybutyl (meth)acrylate, 3-chloro-2-hydroxypropyl (meth)acrylate, and β-hydroxy-β'-(meth)acryloyloxyethyl phthalate; alkyl (meth)acrylates such as methyl (meth)acrylate, ethyl (meth)acrylate, propyl (meth)acrylate, butyl (meth)acrylate, isoamyl (meth)acrylate, 2-ethylhexyl (meth)acrylate, lauryl (meth)acrylate, and stearyl (methacrylate; cycloalkyl (meth) acrylates such as cyclohexyl (meth)acrylate; halogenated alkyl (meth)acrylates such as chloroethyl (meth)acrylate and chloropropyl (meth)acrylate; alkoxyalkyl (meth)acrylates such as methoxyethyl (meth)acrylate, ethoxyethyl (meth) acrylate, and butoxyethyl (meth)acrylate; phenoxyalkyl (meth)acrylates such as phenoxyethyl acrylate and nonyl phenoxyethyl (meth)acrylate; alkoxy alkylene glycol (meth) acrylates such as ethoxydiethylene glycol (meth)acrylate, methoxytriethylene glycol (meth)acrylate, and methoxy dipropylene glycol (meth)acrylate; 2,2-dimethylaminoethyl (meth)acrylate, 2,2-diethylaminoethyl (meth)acrylate, 2-hydroxyethyl (meth)acrylate, and 3-chloro-2-hydroxypropyl (meth)acrylate.

Specific examples of the ethylenically unsaturated compound having two or more ethylenically unsaturated bonds include alkyl diol di(meth)acrylates such as 1,9-nonanediol di(meth)acrylate; polyethylene glycol di(meth)acrylates such as diethylene glycol di(meth)acrylate; polypropylene glycol di(meth)acrylates such as dipropylene glycol di(meth)acrylate; polyhydric (meth)acrylates obtained by causing an addition reaction of a compound having an ethylenically unsaturated bond such as an unsaturated carboxylic acid or an unsaturated alcohol and active hydrogen with trimethylolpropane tri(meth)acrylate, pentaerythritol tri(meth)acrylate, pentaerythritol tetra(meth)acrylate, glycerol tri(meth) acrylate, or ethylene glycol diglycidyl ether; polyhydric (meth)acrylates obtained by causing an addition reaction of an unsaturated epoxy compound such as glycidyl (meth) acrylate with a compound having a carboxylic acid or active hydrogen such as an amine; polyhydric (meth)acrylamides such as methylenebis(meth)acrylamide; and polyhydric vinyl compounds such as divinylbenzene.

The concentration of the polymerizable compound which may be contained in the fatigued developer is not particularly limited, and is preferably 30.0 mass % or less, and more preferably 15.0 mass % or less.

<Polymerization Inhibitor>

Specific examples of the polymerization inhibitor which may be contained in the fatigued developer include hydroquinone monomethyl ether, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-tert-butylphenol), and N-nitrosophenylhydroxyamine cerous salt.

The concentration of the polymerization inhibitor which may be contained in the fatigued developer is not particularly limited, and is preferably 0.3 mass % or less, and more preferably 0.15 mass % or less.

<Plasticizer>

Examples of the plasticizer which may be contained in the fatigued developer include liquid-form rubber, oil, polyester, and phosphoric acid-based compounds.

Specific examples of the liquid-form rubber include liquid-form polybutadiene, liquid-form polyisoprene, and rubber obtained by modifying the above-described rubber with a maleic acid or an epoxy group.

Specific examples of the oil include paraffin, naphthene, and aroma.

Specific examples of the polyester include adipic acid-based polyester.

Specific examples of the phosphoric acid-based compounds include phosphoric acid esters.

The concentration of the plasticizer which may be contained in the fatigued developer is not particularly limited, and is preferably 30 mass % or less, and more preferably 15 mass % or less.

<Development Replenishing Liquid>

The development replenishing liquid adjusts the components of the developer in the developer storage tank. For example, the development replenishing liquid keeps the detergent concentration or the concentration of solid contents in the developer constant.

The development replenishing liquid has the same components as the above-described washing solution. However, it is a developer whose concentration of a chelating agent among the components is higher than that of the washing solution. The chelating agent concentration is determined by the amount of the rinsing liquid and the amount of the development replenishing liquid.

For example, in a case where the amount of the rinsing liquid to be used for each plate in a treatment machine in which the area of a maximum-size plate which can be treated is about 0.5 $m^2$ is 4 liters (L), the minimum amount of the development replenishing liquid is preferably L. or greater, and more preferably 2 L or greater for each plate treatment.

The rinsing liquid and the development replenishing liquid are required to be fed for each plate to be treated. For example, in a treatment machine in which the area of a maximum-size plate which can be treated is about 0.5 $m^2$, it is necessary to perform the treatment so that the total amount of a rinsing liquid and a development replenishing liquid having a detergent concentration of 1.1 mass % is 5 to 15 L.

The development replenishing liquid is preferably prepared so that the concentration of a surfactant such as a detergent in the development replenishing liquid is equal to the concentration of a surfactant such as a detergent in the developer in a case where the rinsing liquid and the development replenishing liquid are mixed. In a case where the concentration of the surfactant in a case where the rinsing liquid and the development replenishing liquid are mixed is lower than the concentration of the developer, the developing speed is reduced. Accordingly, the development replenishing liquid is prepared so that the concentration thereof corresponds to the amount of the rinsing liquid to be fed for each plate treatment.

The present invention is basically configured as described above. The treatment device and the treatment method according to the embodiment of the present invention have been described in detail as above, but the present invention is not limited to the above-described embodiments. It is needless to say that a variety of improvements or modifications may be made without departing from the gist of the present invention.

First Example

Hereinafter, the characteristics of the present invention will be described in greater detail with examples. Materials, reagents, substance amounts and ratios thereof, operations, and the like shown in the following examples are able to be properly changed without departing from the intent of the present invention. Therefore, the scope of the present invention is not limited to the following examples.

In this example, regarding Example 1 and Comparative Example 1, the amount of waste liquid was evaluated.

Devices and chemicals used in Example 1 and Comparative Example 1 will be shown below.

<Imaging Machine>
CDI Spark 4835 Inline (manufactured by ESKO)
<Exposure Machine>
Ultraviolet Exposure Machine Concept 302 ECDLF (product name) (manufactured by Glunz & Jensen)
<Flexographic Printing Plate Precursor>
FLENEX FW-L (a plate having a size of 670 mm×560 mm, manufactured by FUJIFILM Global Graphic Systems Co., Ltd.)'
<Washing Solution>
Aqueous Solution of Finish Power & Pure Powder SP (manufactured by Reckitt Benckiser Japan Ltd.) (concentration is 0.5 mass %)
<Imagewise Exposure of Flexographic Printing Plate Precursor>

Back exposure was performed by exposing a back surface of the above-described flexographic printing plate precursor using the above-described ultraviolet exposure machine with an energy of 80 W for 10 seconds.

Then, a 50% halftone dot image was formed by abrading a mask layer using the above-described imaging machine, and main exposure was performed by exposing a surface (a back surface of the back surface) with 80 W for 1,000 seconds. The flexographic printing plate precursor subjected to the main exposure was used as the flexographic printing plate precursor after imagewise exposure.

<Development Treatment and Rinsing Treatment of Flexographic Printing Plate Precursor>

The flexographic printing plate precursor after imagewise exposure was developed using the treatment device 40 shown in FIG. 2 by the use of the brushes 43 with a temperature of the above-described washing solution set to 50° C. to remove a non-exposed portion. The flexographic printing plate precursor after development was rinsed using fresh water as a rinsing liquid.

Example 1

In Example 1, the amount of the rinsing liquid used was 6.4 L/m$^2$, so the amount of the development replenishing liquid was 7.6 L/m$^2$, and the evaporation amount in the developer storage tank was 1.5 L/m$^2$. The amount of waste liquid is shown in the following Table 1.

Comparative Example 1

Comparative Example 1 is the same as Example 1, except that the rinsing liquid whose amount used was 6.4 L/m$^2$ was not reused and discarded after being used for the rinsing treatment, and that the replenishment with the development replenishing liquid was not performed. The amount of waste liquid is shown in the following Table 1.

As shown in the following Table 1, in Example 1, the rinsing liquid was reused, and it was possible to reduce the amount of waste liquid as compared to Comparative Example 1. As described above, in Example 1, the rinsing liquid was reused, and it was possible to reduce the frequency of replacement of the washing solution to ¹/₁₀ as compared to Comparative Example 1. Therefore, it was possible to reduce the amount of the washing solution per unit area.

When the washing solution is replaced, it is necessary to mechanically wash the developer storage tank before addition of the washing solution. The waste liquid generated in this case is washing waste liquid. As described above, in Example 1, since it was possible to reduce the frequency of replacement of the washing solution to ¹/₁₀ as compared to Comparative Example 1, it was possible to reduce the amount of washing waste liquid per unit area.

TABLE 1

| | Reuse of Rinsing Liquid | Rinsing Liquid (L/m$^2$) | Development Replenishing Liquid (L/m$^2$) | Total (L/m$^2$) | Evaporation Amount (L/m$^2$) | Washing Solution (L/m$^2$) | Washing Waste Liquid (L/m$^2$) | Amount of Waste Liquid (L/m$^2$) |
|---|---|---|---|---|---|---|---|---|
| Example 1 | reused | 6.4 | 7.6 | 14 | −1.5 | 1 | 1.85 | 15.35 |
| Comparative Example 1 | not reused | 6.4 | — | 6.4 | −1.5 | 10 | 18.5 | 33.40 |

Second Example

In this example, regarding Example 10 and Comparative Example 10, the on-plate debris pieces and the developing time were evaluated. The results thereof are shown in the following Table 2. The rinsing liquids, development replenishing liquids, and washing solutions used in Example 10 and Comparative Example 10 are also shown in the following Table 2.

In Example 10 and Comparative Example 10, the same imaging machine, exposure machine, flexographic printing plate precursor, and washing solution as in the above-described first example were used.

The imagewise exposure of a flexographic printing plate precursor was also performed in the same manner as in the above-described first example.

Hereinafter, the on-plate debris pieces and the developing time will be described.

[On-Plate Debris Pieces]

After the development treatment of the flexographic printing plate precursor, drying, post-exposure, and detack (pressure sensitive adhesion reduction exposure) were performed.

Those which remain on the flexographic printing plate precursor after the above-described drying, post-exposure, and detack (pressure sensitive adhesion reduction exposure) and cannot be removed by brushing, tape peeling, or the like were all defined as adhesive debris pieces.

The on-plate debris pieces were evaluated by treating one flexographic printing plate precursor. Then, 100 flexographic printing plate precursors were treated for evaluation. The plate face was visually examined for each treated flexographic printing plate precursor to confirm the presence or absence of adhesive debris pieces having a size of 100 μm or greater. The following Table 2 shows the number of adhesive debris pieces (number of pieces/plate).

In a case where there is even one adhesive debris piece having a size of 100 μm or greater as a result of the visual examination of the plate face of the treated flexographic printing plate precursor, this case was evaluated as poor

[Developing Time]

Regarding the developing time, a time required to develop a flexographic printing plate precursor, whose thickness was 1.7 mm before development, until the thickness became 1.1 mm was measured. The results thereof are shown in the following Table 2. The shorter the developing time, the better the developing performance.

Example 10

In Example 10, fresh water was used as the rinsing liquid. In addition, the amount thereof used was 6.4 L/m², whereby the amount of the development replenishing liquid was 9.2 L/m². In Example 10, a case where one plate was treated and a case where 100 plates were treated were shown.

Comparative Example 10

Comparative Example 10 was the same as Example 10, except that a washing solution was used as the rinsing liquid, and the amount thereof used was 14 L/m², and that the amount of the development replenishing liquid was 14 L/m².

The dispersing agent shown in the following Table 2 is a mixture of an alkaline agent, a chelating agent, and a surfactant.

TABLE 2

| | Rinsing Liquid | | | | Development Replenishing Liquid | | | Washing Solution | | Evaluation | |
| --- | --- | --- | --- | --- | --- | --- | --- | --- | --- | --- | --- |
| | Treatment Amount (number of plates) | Dispersing Agent Concentration (%) | Cheleating Agent Concentration (%) | Replenishing Amount (L/m²) | Dispersing Agent Concentration (%) | Cheleating Agent Concentration (%) | Replenishing Amount (L/m²) | Dispersing Agent Concentration (%) | Cheleating Agent Concentration (%) | On-plate Debris Pieces (number of pieces/plate) | Development Time (number of plates/minute) |
| Example 10 | 1 | 0 | 0 | 6.4 | 0.76 | 0.125 | 9.2 | 0.5 | 0.083 | 0 | 6 |
| | 100 | 0 | 0 | 6.4 | 0.76 | 0.125 | 9.2 | 0.5 | 0.083 | 0 | 6 |
| Comparative Example 10 | 1 | 0.5 | 0.083 | 14 | | | | 0.5 | 0.083 | 0 | 6 |
| | 100 | 0.5 | 0.083 | 14 | | | | 0.8 | 0.083 | 0 | 10 |

As shown in Table 2, in Example 10, it was possible to reduce the developing time as compared to Comparative Example 10, even in a case where the number of plates to be treated was increased.

EXPLANATION OF REFERENCES

10: treatment system
12: exposure portion
14: developing portion
15: rinsing portion
16: developer storage portion
16a: developer storage tank
16b: developer replenishing tank
18: developer supply portion
20: developer replenishing portion
22: measurement portion
24: pump
25: filter
26: heater
27: switching valve
28: valve
29: waste liquid tank
30: control portion
31: first liquid feeding path
32: second liquid feeding path
33, 34, 35: connecting pipe
40, 40a: treatment device
42: developing unit
43, 82: brush
44: rinsing liquid supply portion
45: nozzle
46: developing tank
47: transport roller
48: table
49: support
50: flexographic printing plate precursor 50a: front surface
50b: back surface
50c: end portion
60: characteristic curve
62: characteristic line
62a: developer replacement timing
62b: initial timing
64: characteristic curve
70: housing
71: developing tank
71a: inlet
71b: outlet
72: transport portion
73: rinsing tank
73b: side wall
74: first transport roller pair
74a, 74b, 76a, 76b, 86a, 86b, 88a, 88b: roller
76: second transport roller pair
78, 80, 86, 88: transport roller pair
84: guide roller
D: transport direction
Db: transport passage
Dp: transport path

What is claimed is:

1. A treatment device comprising:
a developing portion which is provided with a developing unit which performs development by removing a non-exposed portion of a flexographic printing plate precursor after imagewise exposure using a developer containing a washing solution;
a rinsing portion which is provided with a rinsing liquid supply portion which supplies a rinsing liquid containing substantially only water as a component to at least a surface of the flexographic printing plate precursor after development, from which the non-exposed portion of the flexographic printing plate precursor has been removed;
a developer storage portion which has a developer storage tank which stores the developer which is used for the development in the developing portion;
a first liquid feeding path through which the developer after development is fed to the developer storage tank of the developer storage portion; and
a second liquid feeding path different from the first liquid feeding path, through which the rinsing liquid supplied by the rinsing portion is fed to the developer storage tank of the developer storage portion,
wherein the developing portion repeatedly uses the developer stored in the developer storage tank of the developer storage portion to perform the development.

2. The treatment device according to claim 1, further comprising:
a developer replenishing portion which replenishes the developer storage tank of the developer storage portion with a developer having a higher chelating agent concentration than the developer stored in the developer storage tank of the developer storage portion, as a development replenishing liquid.

3. The treatment device according to claim 2,
wherein an amount of the development replenishing liquid with which the developer storage tank is replenished by the developer replenishing portion is determined according to an amount of the rinsing liquid which is fed to the developer storage tank of the developer storage portion.

4. The treatment device according to claim 2,
wherein a ratio of an amount of the rinsing liquid which is fed to the developer storage tank of the developer storage portion to an amount of the development replenishing liquid is constant.

5. The treatment device according to claim 2,
wherein a total amount of the rinsing liquid which is fed to the developer storage tank of the developer storage portion and the development replenishing liquid is 10 to 30 $L/m^2$ with respect to an area of the developed flexographic printing plate precursor.

6. The treatment device according to claim 2, further comprising:
a control portion which detects a timing of supply of the rinsing liquid to the flexographic printing plate precursor, and causes the developer replenishing portion to supply the development replenishing liquid to the developer storage tank of the developer storage portion after supply of the rinsing liquid.

7. The treatment device according to claim 1, further comprising:
a transport portion which transports the flexographic printing plate precursor,
wherein the rinsing portion is provided on a downstream side of the developing portion in a transport direction of the flexographic printing plate precursor.

8. A treatment method comprising:
a developing step of performing development by removing a non-exposed portion of a flexographic printing plate precursor after imagewise exposure using a developer containing a washing solution; and
a rinsing step of supplying a rinsing liquid containing substantially only water as a component to at least a surface of the flexographic printing plate precursor after development, from which the non-exposed portion of the flexographic printing plate precursor has been removed,
wherein the developer which is used for the development is fed to a developer storage tank which stores the developer via a first liquid feeding path,
the rinsing liquid supplied in the rinsing step is fed to the developer storage tank via a second liquid feeding path different from the first liquid feeding path, and
in the developing step, the developer stored in the developer storage tank is repeatedly used for the development.

9. The treatment method according to claim 8, further comprising:
a step of replenishing the developer storage tank with a developer having a higher chelating agent concentration than the developer stored in the developer storage tank, as a development replenishing liquid.

10. The treatment method according to claim 9,
wherein an amount of the development replenishing liquid with which the developer storage tank is replenished is determined according to an amount of the rinsing liquid.

11. The treatment method according to claim 9,
wherein a ratio of an amount of the rinsing liquid which is fed to the developer storage tank to an amount of the development replenishing liquid is constant.

12. The treatment method according to claim 9,
wherein a total amount of the rinsing liquid which is fed to the developer storage tank and the development replenishing liquid is 10 to 30 $L/m^2$ with respect to an area of the developed flexographic printing plate precursor.

13. The treatment method according to claim 9,
wherein a timing of supply of the rinsing liquid to the flexographic printing plate precursor is detected, and after the rinsing liquid is supplied, the development replenishing liquid is supplied to the developer storage tank.

14. The treatment method according to claim 8,
wherein the flexographic printing plate precursor is transported along a transport path, and the developing step and the rinsing step are performed.

15. The treatment device according to claim 3, further comprising:
a control portion which detects a timing of supply of the rinsing liquid to the flexographic printing plate precursor, and causes the developer replenishing portion to supply the development replenishing liquid to the developer storage tank of the developer storage portion after supply of the rinsing liquid.

16. The treatment device according to claim 2, further comprising:
a transport portion which transports the flexographic printing plate precursor,
wherein the rinsing portion is provided on a downstream side of the developing portion in a transport direction of the flexographic printing plate precursor.

17. The treatment method according to claim 10,
wherein a timing of supply of the rinsing liquid to the flexographic printing plate precursor is detected, and after the rinsing liquid is supplied, the development replenishing liquid is supplied to the developer storage tank.

18. The treatment method according to claim 9,
wherein the flexographic printing plate precursor is transported along a transport path, and the developing step and the rinsing step are performed.

19. The treatment device according to claim 4, further comprising:
a control portion which detects a timing of supply of the rinsing liquid to the flexographic printing plate precursor, and causes the developer replenishing portion to supply the development replenishing liquid to the developer storage tank of the developer storage portion after supply of the rinsing liquid.

20. The treatment device according to claim 3, further comprising:
a transport portion which transports the flexographic printing plate precursor,
wherein the rinsing portion is provided on a downstream side of the developing portion in a transport direction of the flexographic printing plate precursor.

\* \* \* \* \*